US012702009B2

(12) United States Patent
Tong

(10) Patent No.: US 12,702,009 B2
(45) Date of Patent: Aug. 4, 2026

(54) SEMICONDUCTOR DEVICE AND MANUFACTURING METHOD THEREOF

(71) Applicant: nD-HI Technologies Lab, Inc., Taipei City (TW)

(72) Inventor: Ho-Ming Tong, Taipei City (TW)

(73) Assignee: nD-HI Technologies Lab, Inc., Taipei City (TW)

( * ) Notice: Subject to any disclaimer, the term of this patent is extended or adjusted under 35 U.S.C. 154(b) by 677 days.

(21) Appl. No.: 18/111,302

(22) Filed: Feb. 17, 2023

(65) Prior Publication Data

US 2023/0268288 A1 Aug. 24, 2023

Related U.S. Application Data

(60) Provisional application No. 63/311,466, filed on Feb. 18, 2022.

(51) Int. Cl.
| | |
|---|---|
| *H10W 42/20* | (2026.01) |
| *H10B 80/00* | (2023.01) |
| *H10W 70/05* | (2026.01) |
| *H10W 70/63* | (2026.01) |
| *H10W 70/685* | (2026.01) |
| *H10W 74/01* | (2026.01) |
| *H10W 90/00* | (2026.01) |

(52) U.S. Cl.
CPC ............ *H10W 42/20* (2026.01); *H10B 80/00* (2023.02); *H10W 70/05* (2026.01); *H10W 70/095* (2026.01); *H10W 70/635* (2026.01); *H10W 70/685* (2026.01); *H10W 74/01* (2026.01); *H10W 90/00* (2026.01); *H10W 70/093* (2026.01)

(58) Field of Classification Search
CPC ..... H01L 23/552; H01L 23/60; H01L 21/486; H01L 23/49827; H10W 42/20; H10W 42/60
See application file for complete search history.

(56) References Cited

U.S. PATENT DOCUMENTS

| | | | | |
|---|---|---|---|---|
| 2004/0245640 A1* | 12/2004 | Tsukamoto | ........... | H01L 23/552 257/E23.114 |
| 2009/0302438 A1* | 12/2009 | Chauhan | ............... | H01L 23/552 257/659 |
| 2015/0325529 A1* | 11/2015 | Choi | ........................ | H01L 21/50 257/723 |

(Continued)

FOREIGN PATENT DOCUMENTS

WO 2019066870 A1 4/2019

OTHER PUBLICATIONS

Taiwan Office action issued by the TIPO on Mar. 29, 2024, corresponding to application No. 112105777, 5 pages.

*Primary Examiner* — Evan G Clinton
(74) *Attorney, Agent, or Firm* — Innovation Counsel LLP

(57) ABSTRACT

A semiconductor device includes a substrate module and a first processor. The substrate module includes a first substrate, a first voltage regulator component and a first grounded Faraday component. The first voltage regulator component is embedded in the first substrate and includes a plurality of surfaces. The first grounded Faraday component is embedded in the first substrate and covers one or more of the surfaces of the first voltage regulator component. The first processor is disposed over the substrate module.

13 Claims, 11 Drawing Sheets

P1

(56)          References Cited

U.S. PATENT DOCUMENTS

2020/0091608 A1      3/2020  Alpman et al.
2022/0157740 A1*    5/2022  Verhaverbeke ......... H01L 24/92
2022/0344287 A1*   10/2022  Yu ........................... H01L 24/92

* cited by examiner

711B

711A

711C

10

714

711B

711A

711C

10

815

711C

712

711A

711B

714

20

SEMICONDUCTOR DEVICE AND MANUFACTURING METHOD THEREOF

This application claims the benefit of U.S. provisional application Ser. No. 63/311,466, filed Feb. 18, 2022, the disclosures of which are incorporated by reference herein in its entirety.

TECHNICAL FIELD

The disclosure relates in general to a semiconductor device and a manufacturing method thereof.

BACKGROUND

Conventional power regulation solutions need many discrete components externally supporting the processor IC flip chip bonded to a substrate. In the conventional solutions, DC-DC power converters or voltage regulators such as buck converters convert power from a high voltage to a low voltage for diverse microelectronics applications using power converter components, e.g., power management/control IC, power switches, large inductors and bulky capacitors mounted on a printed circuit board at a large distance away from the processor.

This large distance consumes power from the power converter and creates significant power losses in the interconnect from the printed circuit board to the processor due to thermal conduction loss (=$I^2R$ where I is current and R is line resistance) and large AC impedance leading to dynamic changes in processor power consumption that requires power supply margins to ensure a high enough voltage for efficient operation of the processor. This also leads to bigger footprint, more complex design, poor system power efficiency, inadequate response time, and lower accuracy than desired, thereby enlarging the energy footprint of digital world/economy.

SUMMARY

This application discloses creation of embedded and grounded Faraday caged or shielded voltage regulator structures and/or sub-circuitries in a preferably fine-line/space package substrate (upon which the processor is mounted) to greatly reduce the distance between power conversion circuits and the processor (as embedding voltage regulator structures and/or sub-circuitries in the substrate allow them to be closest to the processor), and achieve high system energy efficiency and enhanced performance while reducing EMI susceptibility for advanced processors in packages including but not limited to 2D, 2.5D and 3D IC packages.

According to an embodiment, a semiconductor device is provided. The semiconductor device includes a substrate module and a first processor. The substrate module includes a first substrate, a first voltage regulator component and a first grounded Faraday component. The first voltage regulator component is embedded in the first substrate and includes a plurality of surfaces. The first grounded Faraday component is embedded in the first substrate and covers one or more of the surfaces of the first voltage regulator component. The first processor is disposed over the substrate module.

According to another embodiment, the semiconductor device further includes a second substrate over which the first substrate is disposed.

According to another embodiment, the substrate module further includes a first RDL containing a metal plane formed on a first side of the first substrate and electrically connected with the first voltage regulator component.

According to another embodiment, the substrate module further includes a second RDL containing a metal plane formed on a second side of the first substrate and electrically connected with the first voltage regulator component; and a conductive through via formed within the first substrate on one side, two sides, three sides or all four sides of the first voltage regulator component connecting the first RDL with the second RDL.

According to another embodiment, the first grounded Faraday component is grounded through a ground plane formed in the first substrate which is a fine-line/space substrate.

According to another embodiment, the substrate module further includes a second voltage regulator component embedded in the first substrate, wherein the first voltage regulator component and the second voltage regulator component are disposed side by side.

According to another embodiment, the substrate module further includes a second voltage regulator component embedded in the first substrate, wherein the first voltage regulator component and the second voltage regulator component are disposed in a thickness direction.

According to another embodiment, the semiconductor device further includes a memory element disposed over the substrate module, wherein the first processor and the memory element are disposed side by side.

According to another embodiment, the semiconductor device further includes a first memory element disposed over the first processor.

According to another embodiment, the semiconductor device further includes a second processor disposed over the substrate module; and a second memory element disposed over the second processor, wherein the first processor and the second processor are disposed side by side.

According to another embodiment, the first substrate has a recess within which the first voltage regulator component is disposed; the substrate module further includes a first encapsulation body formed within the recess and encapsulating the first voltage regulator component; and the first grounded Faraday component covering the first encapsulation body.

According to another embodiment, the substrate module further includes a first RDL formed on the first grounded Faraday component.

According to another embodiment, the substrate module further includes a second voltage regulator component disposed within the recess; a second encapsulation body formed within the recess and encapsulating the second voltage regulator component, wherein the first encapsulation body and the second encapsulation body are separated by an interval; a second grounded Faraday component covering the second encapsulation body; and a metal filling the interval.

According to another embodiment, a manufacturing method for a semiconductor device is provided. The manufacturing method includes the following steps: embedding a first voltage regulator component in a first substrate to form a substrate module; disposing a first grounded Faraday component in the first substrate, wherein the first grounded Faraday component covers the first voltage regulator component; and disposing a first processor over the first substrate.

According to another embodiment, the manufacturing method further includes: forming a recess on the first substrate; disposing the first voltage regulator component within the recess; forming a first encapsulation body within the recess and encapsulating the first voltage regulator component; and forming a first grounded Faraday component to cover the first encapsulation body.

According to another embodiment, the manufacturing method further includes: forming a first RDL on the first grounded Faraday component.

According to another embodiment, the manufacturing method further includes: disposing a second voltage regulator component within the recess; forming an encapsulation material within the recess and encapsulating the first voltage regulator component and the second voltage regulator component; forming at least one interval passing through the encapsulation material to form the first encapsulation body and a second encapsulation body encapsulating the second voltage regulator component, wherein the first encapsulation body and the second encapsulation body are separated by the interval; and forming a second grounded Faraday component to cover the second encapsulation body.

According to another embodiment, the manufacturing method further includes: filling the interval with a metal.

The above and other aspects of the disclosure will become better understood with regard to the following detailed description of the preferred but non-limiting embodiment(s). The following description is made with reference to the accompanying drawings.

Figures 1, 2:
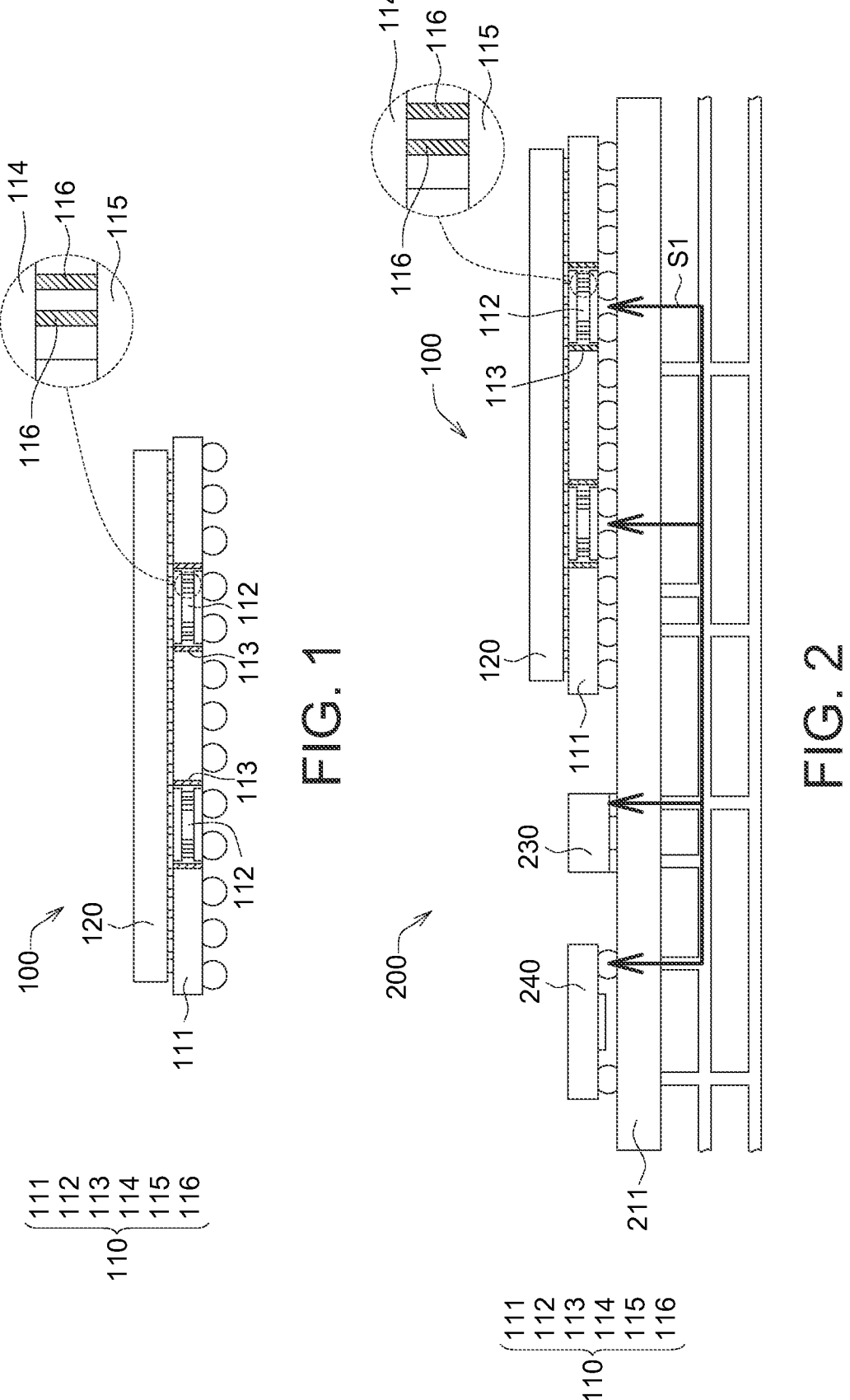
FIG. 1 is a schematic diagram of a semiconductor device according to an embodiment of the present disclosure.
FIG. 2 is a schematic diagram of a semiconductor device according to an embodiment of the present disclosure.

In the following detailed description, for purposes of explanation, numerous specific details are set forth in order to provide a thorough understanding of the disclosed embodiments. It will be apparent, however, that one or more embodiments could be practiced without these specific details. In other instances, well-known structures and devices are schematically shown in order to simplify the drawings.

DETAILED DESCRIPTION

Embodiments of the invention relate to electronic systems including integrated circuits (ICs) and Faraday shielding of embedded voltage regulators, circuitries and/or sub-circuitries for greatly enhanced system efficiency and reduced electromagnetic interference (EMI) involving advanced ICs and advanced packages including 2D, 2.5D and 3D IC packages for particularly high-end processor applications such as data centers, high-performance computing (HPC) and artificial intelligence (AI).

An embodiment of the present invention discloses embedded and grounded Faraday caged or shielded voltage regulator structures and/or sub-circuitries in substrate and/or active devices to achieve high system energy efficiency, reduced EMI susceptibility and enhanced performance for advanced packages including but not limited to 2D, 2.5D and 3D IC packages. Grounded Faraday cages operate to block the effects of an external field on its internal contents or ICs, or the effects of an internal field on the outside environment or ICs. They can shield the ICs in the cages from external magnetic radiation provided that the mesh is smaller than a fraction (e.g., 1/10th) of the wavelength of the IC operating frequency and that the shields are sufficiently thick. Voltage regulators, integrated voltage regulators (IVRs), power regulating circuitries and/or sub-circuitries integrated with the processor package at the IC and package substrate levels with proper shielding can improve efficiency and provide as much as 10 times reduction in printed circuit board (PCB) footprint while reducing the power architecture complexity, leading to better system reliability and shortened development schedule. In addition to escalating power consumption, data center power density requirements continue to increase year after year. The average rack power density is currently around 7-16 k W. For data centers, HPC, and AI applications, power densities can reach an upward of 100 k W per rack. Data centers is maxing out on how much heat they can dissipate for applications such as servers, network interface cards (NICs), or fiber-optic transceivers and servers alone are driving 40 percent of the power used in data centers. In addition, servers are maxing out on the trade-off between switching speed and power efficiency. Besides data center, HPC and AI applications, power management also presents a challenge for small devices requiring extremely high densities such as optical transceivers as power supplies are bulky and too far away from them due to shear large size. Power density hungry applications which can benefit from this invention in terms of reduced size and cost, and improved system efficiencies and others include data centers, HPC, AI, and 5G/RF covering switches, routers, servers, interface cards, optical transceivers, ASIC, CPU/MPU, AI chips, FPGA, GPU and high bandwidth data links such as PCIe.

Referring to FIG. 1, FIG. 1 is a schematic diagram of a semiconductor device 100 according to an embodiment of the present disclosure. The semiconductor device 100 includes a substrate module 110 and a first processor 120. The substrate module 110 includes a first substrate 111, at least one first voltage regulator component 112, at least one first grounded Faraday component 113, at least one first RDL (re-distributed layer) 114, at least one second RDL 115 and at least one conductive through via 116. The first voltage regulator component 112 is embedded in the first substrate 111 and includes a plurality of surfaces, such as at least one lateral surface, an upper surface and/or a lower surface. The first grounded Faraday component 113 is embedded in the first substrate 111 and covers one or more of the surfaces of the first voltage regulator component 112. In an embodiment, the first grounded Faraday component 113 could include the first RDL 114, the second RDL 115 and the conductive through via 116 to cover and/or surround the first voltage regulator component 112. Though not shown, the first processor 120 is typically flip chip bonded to the first substrate 111 with the use of an underfill, a non-conductive paste or a non-conductive film to encapsulate the flip chip joints (e.g., based on copper pillar micro-bumps). The semiconductor device can also be further encapsulated or molded with a molding compound with the backside or top side of the first processor 120 exposed (i.e., without the molding compound) after molding for attachment to a heat spreader and a heatsink using thermal interface materials for thermal management.

In an embodiment, the first substrate 111 is, for example, a laminate substrate, a silicon substrate, a metal leadframe substrate, a glass substrate or other types of suitable substrate. A plurality of solder balls is formed on a lower surface of the first substrate 111. In an embodiment, the first substrate 111 is, for example, a fine-line/space substrate.

As shown in FIG. 1, the first voltage regulator components 112 are disposed inside the first substrate 111 side by side. In an embodiment, the first voltage regulator component 112 is, for example, a voltage regulator component, a voltage regulating circuit, a sub-circuitry and/or a passive component. In another embodiment, the first voltage regulator component 112 is, for example, an Integrated Voltage Regulator (IVR).

For energy hungry, data-intensive applications such as data centers, HPC and AI, small-sized (on the order of 100 μm (micrometer) thick) IVRs are becoming available. They provide performance, board space saving and cost benefits compared to conventional power management solutions. Other benefits of IVRs for data-intensive applications include enhanced reliability system enhanced reliability (stemming from a smaller number of connections, reduced susceptibility to EMI, a minimized bill of materials and a greatly reduced PCB footprint), dramatic system efficiency improvement leading to as much as 30% to 50% system energy savings, thanks to fast transient response (that can be up to one hundredth times shorter than conventional solutions sometimes without needing additional capacitors), fast dynamic voltage scaling (in a matter of nanoseconds which is as much as 1000 times faster than conventional solutions; this enables fast and lossless processor state changes that dramatically improves efficiencies in controlling CPUs, GPUs and any other fast, clock driven digital silicon), as well as high integration densities derived from small form factor IVRs coupled very closely to digital load (which can eliminate losses and large banks of decoupling capacitors). IVRs are increasing becoming more important for data intensive applications that require improving system performance and functionality while simultaneously increasing efficiency and power density. IVRs (their circuitries and/or sub-circuitries), inductors and capacitors could be available in small form factors, as thin as 100 μm making them amenable to embedding in chip bearing substrates or on active devices. In an embodiment, the IVRE (IVR ensemble encompassing all needed voltage regulating circuitries) or part of it can be located and properly shielded close to the processor, inside an IC package (on the substrate, and/or embedded in the substrate, whether it be based on laminate, glass, glass ceramic, silicon as in the case of silicon interposer in 2.5D IC or others), inside an active chip and/or on chip. When needed, conformal and/or compartment shields created using, for instance, physical vapor deposition (e.g. sputtering) can also be implemented to enhance EMI shielding over active devices.

As shown in FIG. 1, the first grounded Faraday component 113 is embedded in the first substrate 111 and covers one or more of the surfaces of the first voltage regulator component 112. Furthermore, the first grounded Faraday component 113 covers or surrounds the first voltage regulator component 112 on one or more of six surfaces of the first voltage regulator component 112, such as four lateral surfaces, the upper surface and the lower surface. In addition, the first grounded Faraday component 113 could be shaped into a shield or a cage. The first grounded Faraday component 113 is grounded through, for example, a ground plane in the first substrate 111. The first grounded Faraday component 113 could shield EMI (electromagnetic interference) from the first voltage regulator component 112 and other EMI generating components nearby. In another embodiment, the first grounded Faraday component 113 is a conformal shielding component (electrically connected to a ground plane) which could conformally shield the first voltage regulator component 112.

As shown in FIG. 1, the first RDL 114 containing a metal plane formed on a first side of the first substrate 111 and which can be electrically connected with the first voltage regulator component 112. The first RDL 114 can be used to interconnect silicon interconnect substrates as needed. In addition, the second RDL 115 containing a metal plane formed on a second side (opposite to the first side) of the first substrate 111 and which can be electrically connected with the first voltage regulator component 112. The conductive through via 116 is formed within the first substrate 111 on one side, two sides, three sides or all four sides of the first voltage regulator component 112 which can connect the first RDL 114 with the second RDL 115. The first RDL 114 and/or the second RDL 115 could be finer-line (line width, L)/space (line space, S) dielectric/metal RDL built using finer-line/space dielectrics that are different from the dielectrics used in building conventional laminate substrates using conventional laminate substrate processes.

As shown in FIG. 1, the first processor 120 is disposed over the substrate module 110. In an embodiment, the first processor 120 is disposed over the substrate module 110 with optionally a passive component (such as a capacitor, an inductor and/or a resistor) mounted on the first processor 120 or the first substrate 111. In an embodiment, the first processor 120 is, for example, an active chip such as a SoC (system-on-chip), a chiplet or chiplets. Though not shown, main memory such as high-bandwidth-memory (HBM) DRAM stacks can also be mounted on the first substrate in close proximity to the first processor 120.

Referring to FIG. 2, FIG. 2 is a schematic diagram of a semiconductor device 200 according to an embodiment of the present disclosure. The semiconductor device 200 includes the substrate module 110, the first processor 120, a second substrate 211, at least one passive component 230 and at least one pre-regulator 240.

As shown in FIG. 2, the semiconductor device 200 includes the structures similar to or the same as that of the semiconductor device 100 expect that the semiconductor device 200 further includes the second substrate 211, the passive component 230 and the pre-regulator 240.

As shown in FIG. 2, the first substrate 111 is disposed over the second substrate 211. Furthermore, the semiconductor device 100 of FIG. 1 is disposed on the second substrate 211 through the first substrate 111 thereof. In an embodiment, the second substrate 211 is, for example, a printed circuit board (PCB). An external signal S1 could be transmitted to the substrate module 110 and the first processor 120 through the second substrate 211.

As shown in FIG. 2, the passive component 230 is, for example, a capacitor, an inductor and/or a resistor. The passive component 230 and the pre-regulator 240 can be disposed on the second substrate 211 side by side.

Figure 3:
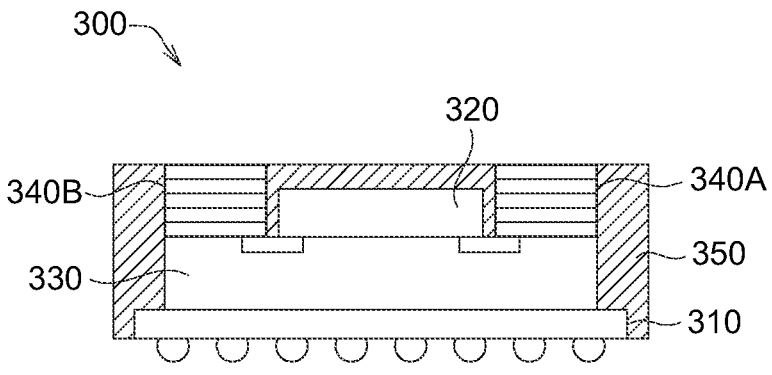
FIG. 3 is a schematic diagram of a semiconductor device according to an embodiment of the present disclosure.

Referring to FIG. 3, FIG. 3 is a schematic diagram of a semiconductor device 300 according to an embodiment of the present disclosure. The semiconductor device 300 includes a substrate module 310, a first processor 320, an interposer 330, at least one first memory element 340A, at least one second memory element 340B and a molding compound 350.

As shown in FIG. 3, the substrate module 310 includes the structure similar to or the same as that of the substrate module 110, and the similarities are not repeated again here. The first processor 320 includes the structure similar to or the same as that of the first processor 120, and the similarities are not repeated again here.

As shown in FIG. 3 and in the present embodiment, the first processor 320, the first memory element 340A and the second memory element 340B are disposed over the substrate module 310 side by side. Furthermore, the first processor 320, the first memory element 340A and the second memory element 340B are indirectly disposed on the substrate module 310 through the interposer 330. The substrate module 310 is electrically connected to the first processor 320, the first memory element 340A and the second memory element 340B through the interposer 330. The first processor 320 is disposed between the first memory element 340A and the second memory element 340B. Alternatively, at least one first memory element 340A and at least one second memory element 340B surrounds at least one of the sides of the first processor 320.

The interposer 330 is, for example, a silicon-based interposer (silicon interposer) or a fine-pitch laminate substrate supporting a silicon interconnect substrate. In an embodiment, the interposer 330 could include the components similar to or the same as those of the first voltage regulator component 112, the first grounded Faraday component 113, the first RDL 114, the second RDL 115 and/or the conductive through via 116 of the substrate module 110. The first memory element 340A and the second memory element 340B can be, for example, 3D multi-die HBM DRAM stacks.

Take the through silicon via (TSV) enabled 2.5D IC, for instance, the silicon interposer serves as the bridge between ICs and the laminate substrate, and the chips including a logic die, a compute processor die such as a FPGA, a base die and a 3D multi-die HBM (high-bandwidth memory) DRAM stack. The dies are interconnected to one another, or to the interposer through TSVs, redistribution layers (RDL) and/or copper pillar micro-bumps.

As shown in FIG. 3, the molding compound 350 is formed on the substrate module 110 and encloses the first processor 320, the interposer 330, the first memory element 340A and the second memory element 340B with the backsides (or top sides) of the first memory element 340A and the second memory element 340B exposed (i.e., without the molding compound) to facilitate thermal management.

Figure 4:
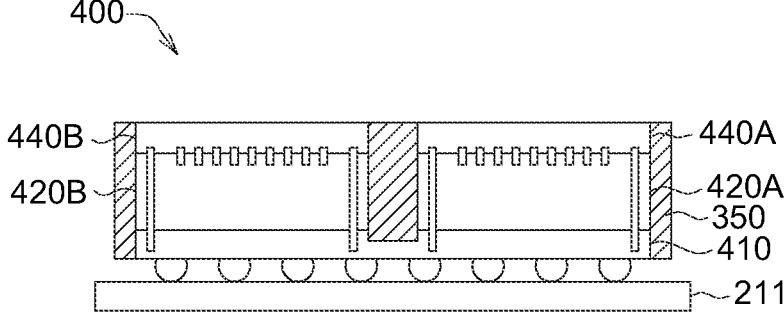
FIG. 4 is a schematic diagram of a semiconductor device according to an embodiment of the present disclosure.

Referring to FIG. 4, FIG. 4 is a schematic diagram of a semiconductor device 400 according to an embodiment of the present disclosure. The semiconductor device 400 includes a substrate module 410, a first processor 420A, a second processor 420B, a first memory element 440A, a second memory element 440B, a molding compound 350 and the second substrate 211.

In the present embodiment and in FIG. 4, the first processor 420A and the second processor 420B are disposed over the substrate module 410 side by side. The first processor 420A and the second processor 420B are directly disposed on the substrate module 410. The first memory element 440A is bonded to the first processor 420A (in the package thickness direction), and the second memory element 440B is bonded to the second processor 420B. The first memory element 440A is electrically connected to the first processors 420A through at least one flip chip bump or at least one copper hybrid bond and is electrically connected to the substrate module 410 through at least one TSV in the first processor 420A. Similarly, the second memory element 440B is electrically connected to the second processors 420B through at least one flip chip bump or at least one copper hybrid bond and is electrically connected to the substrate module 110 through at least one TSV in the second processor 420B.

As shown in FIG. 4, the substrate module 410 includes structure similar to or the same as that of the substrate module 110. The first processor 420A and the second processor 420B each includes structure similar to or the same as that of the first processors 120. The first memory element 440A and the second memory element 440B are, for example, 3D multi-die HBM DRAM stacks.

As shown in FIG. 4, the molding compound 350 is formed on the substrate module 410 and encloses the first processor 420A, the second processor 420B, the first memory element 440A and the second memory element 440B with the backsides (or top sides) of the first processor 420A and the second processor 420B exposed (without the molding compound) to facilitate thermal management.

Figure 5:
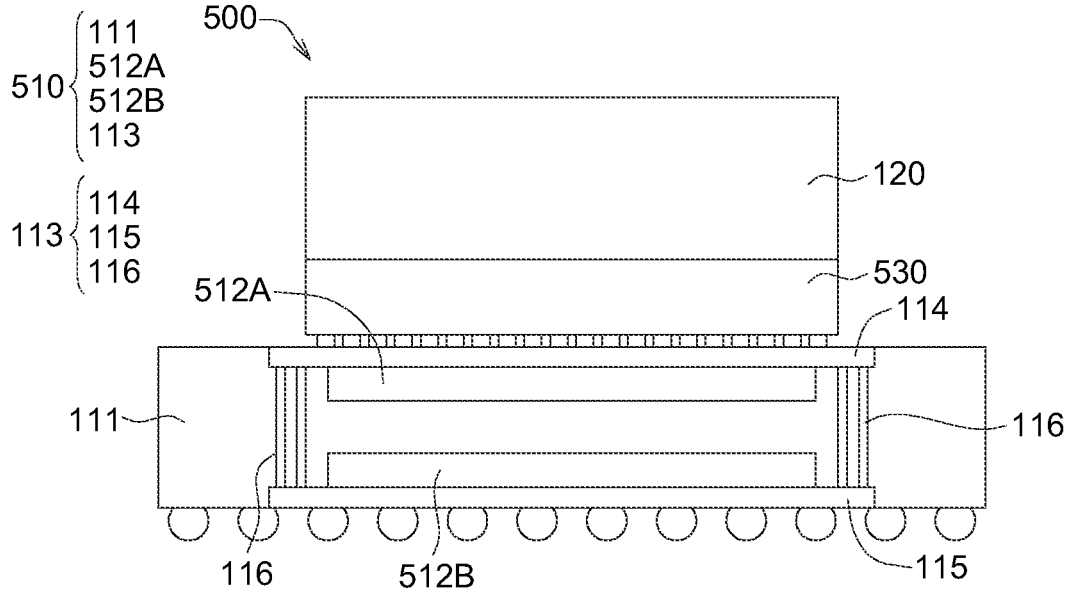
FIG. 5 is a schematic diagram of a semiconductor device according to an embodiment of the present disclosure.

Referring to FIG. 5, FIG. 5 is a schematic diagram of a semiconductor device 500 according to an embodiment of the present disclosure. The semiconductor device 500 includes a substrate module 510, the first processor 120 and at least one passive component 530.

As shown in FIG. 5, the substrate module 510 includes the first substrate 111, at least one first voltage regulator component 512A, at least one second voltage regulator component 512B, at least one first grounded Faraday component 113, at least one first RDL 114, at least one second RDL 115 and at least one conductive through via 116. The first voltage regulator component 512A is embedded in the first substrate 111 and includes a plurality of surfaces, such as at least one lateral surface, an upper surface and/or a lower surface. The first grounded Faraday component 113 is embedded in the first substrate 111 and can cover one or more of the surfaces of the first voltage regulator component 512A. In addition, the second voltage regulator component 512B is embedded in the first substrate 111 and includes a plurality of surfaces, such as at least one lateral surface, an upper surface and/or a lower surface. The first grounded Faraday component 113 is embedded in the first substrate 111 and can cover one or more of the surfaces of the second voltage regulator component 512B.

As shown in FIG. 5, the first voltage regulator component 512A and the second voltage regulator component 512B are disposed within the first substrate 111 in the thickness direction of the first substrate 111.

In an embodiment, the first voltage regulator component 512A is, for example, a voltage regulator component, a voltage regulating circuit, a sub-circuitry, and/or a passive component. In another embodiment, the first voltage regulator component 512A is, for example, an IVR. The second voltage regulator component 512B is, for example, a voltage regulator component, a voltage regulating circuit, a sub-circuitry and/or a component. In another embodiment, the second voltage regulator component 512B is, for example, an IVR.

As shown in FIG. 5, the first grounded Faraday component 113 (which can include and can be coincident with the conductive through via 116, and metal layers and vias in the first RDL 114 and the second RDL 115) is embedded in the first substrate 111 and covers one or more of the surfaces of the first voltage regulator component 512A. Furthermore, the first grounded Faraday component 113 covers or surrounds the first voltage regulator component 512A on one or more of six surfaces, such as four lateral surfaces, the upper surface and the lower surface. Similarly, the first grounded Faraday component 113 can cover one or more of the surfaces of the second voltage regulator component 512B. Furthermore, the first grounded Faraday component 113 can cover or surround the second voltage regulator component 512B on one or more of six surfaces, such as four lateral surfaces, the upper surface and the lower surface.

As shown in FIG. 5, the first RDL 114 containing a metal plane formed on a first side of the first substrate 111 and which can be electrically connected with the first voltage regulator component 512A. In addition, the second RDL 115 containing a metal plane formed on a second side of the first substrate 111 and which can be electrically connected with the second voltage regulator component 512B. The conductive through via 116 is formed within the first substrate 111 and can electrically connect the first RDL 114 with the second RDL 115.

As shown in FIG. 5, the first processor 120 is disposed on the substrate module 510 through the passive component 530. Furthermore, the passive component 530 is disposed between the first processor 120 and the substrate module 510. In an embodiment, the passive component 530 is, for example, on-chip CMOS (Complementary Metal Oxide Semiconductor) capacitor.

Figure 6:
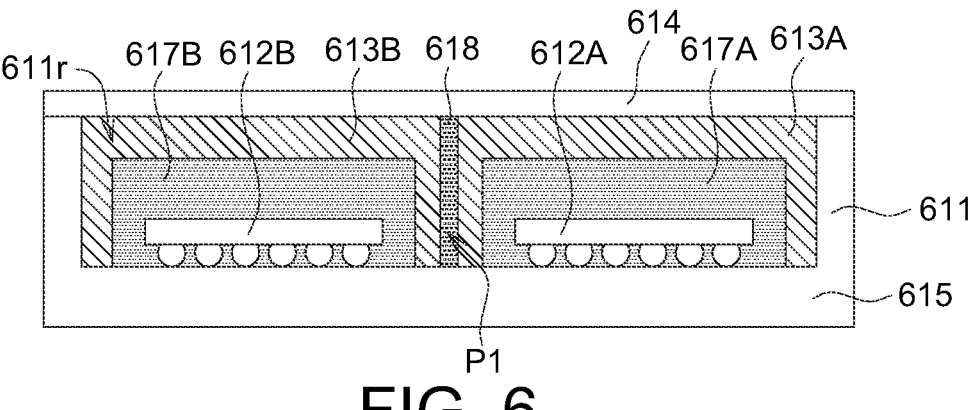
FIG. 6 is a schematic diagram of a substrate module according to another embodiment of the present disclosure.

Referring to FIG. 6, FIG. 6 is a schematic diagram of a substrate module 610 according to another embodiment of the present disclosure. The substrate module as described in the above disclosed embodiment could be replaced by the substrate module 610.

As shown in FIG. 6, the substrate module 610 includes a first substrate 611, at least one first voltage regulator component 612A, at least one second voltage regulator component 612B, at least one first grounded Faraday component 613A, at least one second grounded Faraday component 613B, a first RDL 614, a second RDL 615, a first encapsulation body 617A, a second encapsulation body 617B and a metal 618.

In an embodiment, the first substrate 611 is, for example, a laminate substrate, a silicon substrate, a glass substrate, a metal leadframe substrate or other types of suitable substrates. Although not shown, a plurality of solder balls could be formed on a lower surface of the first substrate 611.

As shown in FIG. 6, the first voltage regulator components 612A and the second voltage regulator components 612B are disposed on the first substrate 611 side by side. In an embodiment, the first voltage regulator component 612A and/or the second voltage regulator component 612B can be, for example, a voltage regulator component, a voltage regulating circuit, a sub-circuitry and/or a passive component. In another embodiment, the first voltage regulator component 612A and/or the second voltage regulator component 612B can be, for example, an IVR.

As shown in FIG. 6, the first substrate 611 which can also serve a Faraday component (for example, the first grounded Faraday component 613A and the second grounded Faraday component 613B) has a recess 611r within which the first voltage regulator component 612A and the second voltage regulator component 612B are disposed. The first encapsulation body 617A is formed within the recess 611r and encapsulates the first voltage regulator component 612A, and the first grounded Faraday component 613A covers or surrounds the first encapsulation body 617A. Similarly, the second encapsulation body 617B is formed within the recess 611r and encapsulates the second voltage regulator component 612B, and the second grounded Faraday component 613B covers or surrounds the second encapsulation body 617B. The first RDL 614 is formed on the first Faraday component 613A and the second Faraday component 613B. The first grounded Faraday component 613A and the second grounded Faraday component 613B could be grounded through a grounded trace or a grounded layer of the first RDL 614 or the second RDL 615.

The IC mounted on the substrate embodying voltage regulated grounded Faraday shield can also be Faraday shielded from other ICs in the same package by forming conformal and/or compartment shielding layers/structures on/in the molding compound which are connected to for example, a ground plane in the substrate. Besides forming the Faraday shields using substrate processes, this package can be conformal shielded by sputtering a thin composite layer (a few micrometers) of, for instance, stainless steel/copper/stainless steel, over the molding compound (with, for instance, the conformal layer connected to the ground layer in the substrate) which is connected to a ground plane in the substrate. When more than one die is involved, the main RF or noisy chip can also be isolated from the other dies, and shielded individually through both conformal shielding and compartment shielding using, for example, metal particles filling compartment vias and sidewalls.

As shown in FIG. 6, the first encapsulation body 617A and the second encapsulation body 617B are separated by an interval P1, and the metal 618 fills the interval P1. The metal 618 together with other Faraday shield elements of the grounded Faraday components 613A and 613B form two compartments that isolate and encage the first voltage regulator 612A and the second voltage regulator 612B from other devices nearby for EMI shielding.

Figure 7:
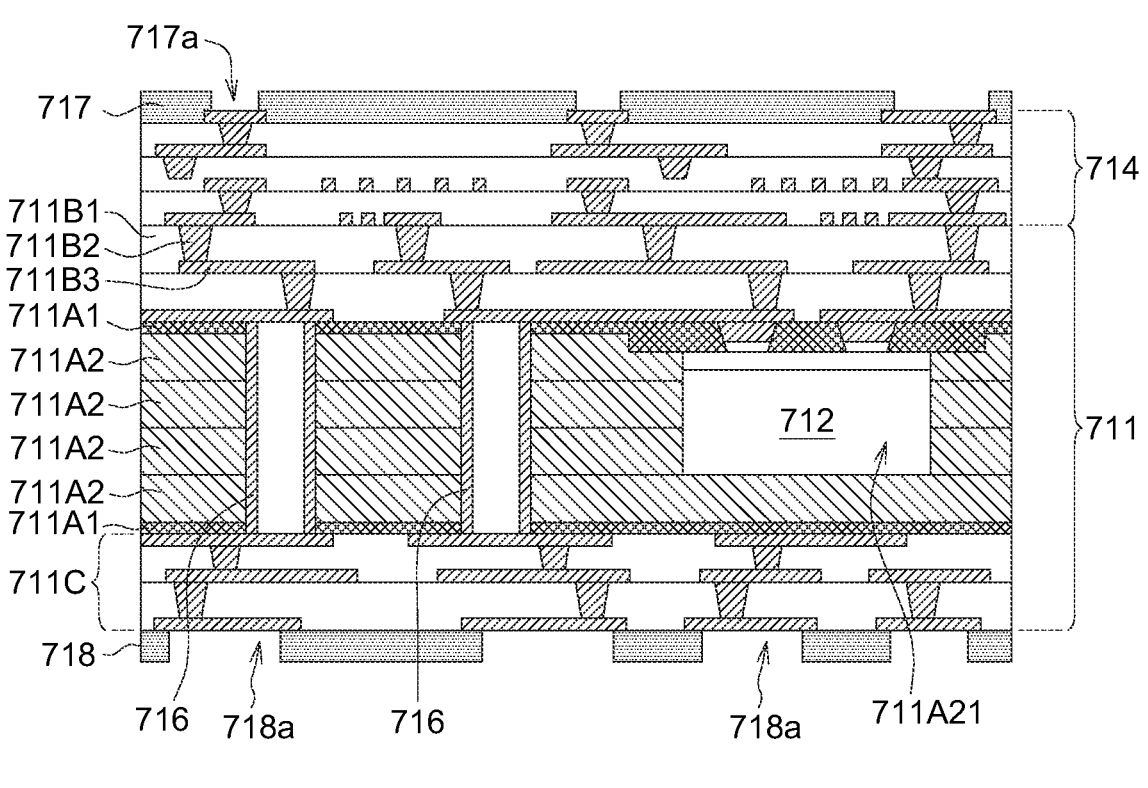
FIG. 7 is a schematic diagram of a substrate module according to another embodiment of the present disclosure.

Referring to FIG. 7, FIG. 7 is a schematic diagram of a substrate module 710 according to another embodiment of the present disclosure. The substrate module as described in the above disclosed embodiment could be replaced by the substrate module 710.

As shown in FIG. 7, the substrate module 710 includes a first substrate 711, at least one semiconductor device 712, a first RDL 714, at least one conductive through via 716, a first solder mask 717 and a second solder mask 718.

As shown in FIG. 7, the first substrate 711 includes a core 711A, a first build-up structure 711B and a second build-up structure 711C.

As shown in FIG. 7, the core 711A includes a plurality of first dielectric layer 711A1 and a plurality of second dielectric layers 711A2, wherein the first dielectric layers 711A1 are disposed on two opposite sides of the semiconductor device 712. At least one of the second dielectric layers 711A2 is pre-punched prepreg layer for receiving the semiconductor device 712. Furthermore, some second dielectric layers 711A2 have a recess 711A21 within which the semiconductor device 712 is disposed. In another embodiment, at least one active component and/or at least one passive component can be disposed within the recess 711A21 and electrically connected with the semiconductor device 712 through the first RDL 714, for example. In addition, the pre-punched prepreg layer can be formed of a material including, for example, BT (bismaleimide triazine) resin/glass fabric.

In an embodiment, the semiconductor device 712 is, for example, an active component or a passive component. For example, the semiconductor device 712 is a voltage regulator component (for example, the first voltage regulator component 112), a voltage regulating circuit, a sub-circuitry and/or a passive component. In the present embodiment, the semiconductor device 712 can be electrically connected to the first RDL 714 through the first build-up structure 711B, and/or electrically connected to the second build-up structure 711C through the conductive through via 716.

As shown in FIG. 7, the conductive through via 716 passes through at least one of the first dielectric layer 711A1, and the second dielectric layers 711A2 for electrically connecting the first build-up structure 711B with the second build-up structure 711C.

As shown in FIG. 7, the first build-up structure 711B includes at least one dielectric layer 711B1, at least one conductive via 711B2 and at least one conductive layer 711B3. The dielectric layer 711B1 is formed of a finer-L/S material including, for example, polyimide (PI), polybenzo-xazole (PBO), etc. The conductive via 711B2 and the conductive layer 711B3 could be formed of a material including, for example, metal such as copper. The conductive via 711B2 passes through the dielectric layer 711B1. The conductive layer 711B3 is formed on a surface of the dielectric layer 711 B1 and connects the conductive via 711B2 and/or another conductive layer 711B3.

As shown in FIG. 7, the second build-up structure 711C can include the structure similar to or the same as that of the first build-up structure 711B, and are not repeated again here due to similarities.

As shown in FIG. 7, the first solder mask 717 is formed on the first RDL 714. The first solder mask 717 has at least one first opening 717a to expose at least one conductive layer of the first RDL 714. The second solder mask 718 is formed on the second build-up structure 711C. The second solder mask 718 has at least one second opening 718a to expose at least one conductive layer of the second build-up structure 711C. In another embodiment, the substrate module 710 could omit the first solder mask 717 and/or the second solder mask 718.

Figure 8:
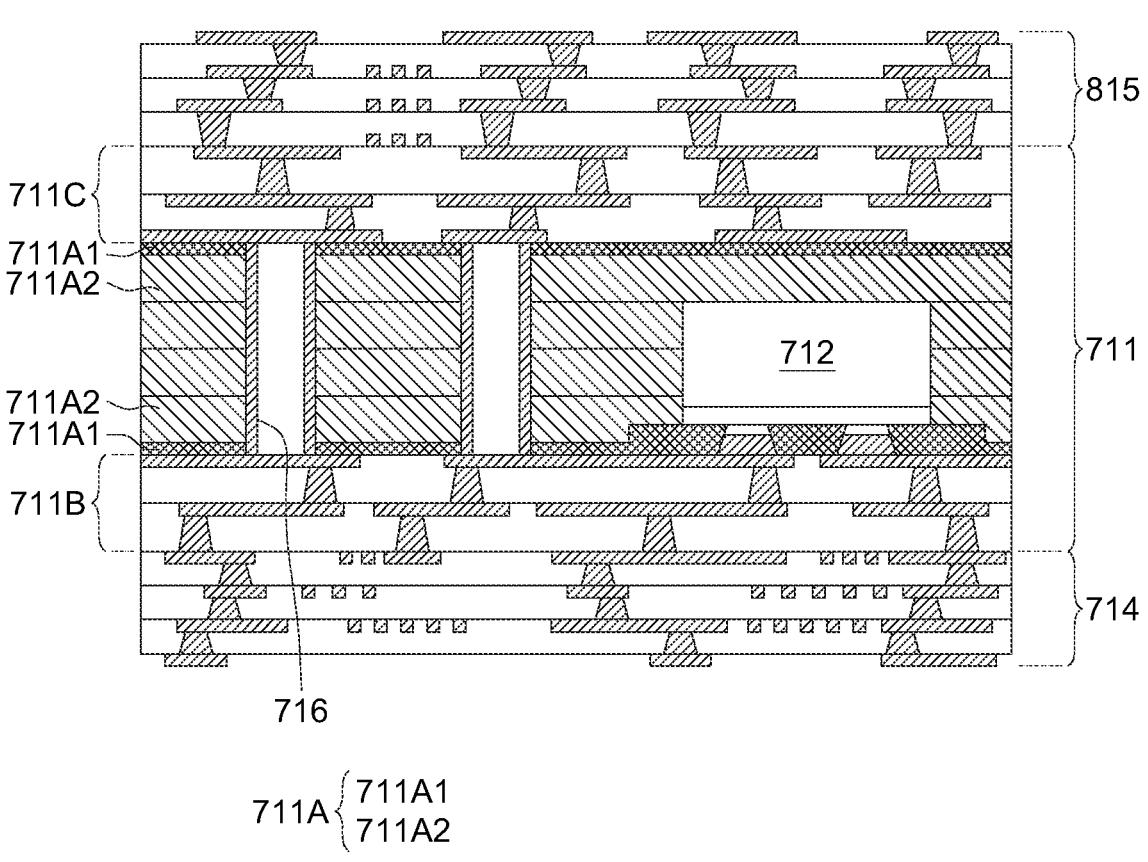
FIG. 8 is a schematic diagram of a substrate module according to another embodiment of the present disclosure.

Referring to FIG. 8, FIG. 8 is a schematic diagram of a substrate module 810 according to another embodiment of the present disclosure. The substrate module as above disclosed embodiment could be replaced by the substrate module 810.

As shown in FIG. 8, the substrate module 810 includes a first substrate 711, at least one semiconductor device 712, a first RDL 714, a second RDL 815 and at least one conductive through via 716.

In the present embodiment, the semiconductor device 712 is electrically connected to the first RDL 714 through the first build-up structure 711B, and is electrically connected to the second RDL 815 through the second build-up structure 711C and the conductive through via 716.

In an embodiment, a manufacturing process of the semiconductor device includes the following steps: disposing (or embedding) a first IVR in a first substrate to form a substrate module; disposing (or embedding) a first grounded Faraday component in the first substrate, wherein the first grounded Faraday component covers the first IVR; and disposing a first processor over the first substrate.

FIGS. 9A to 9G are schematic diagrams of manufacturing processes of the substrate module 710 of FIG. 7 according to an embodiment.

Firstly, a first IVR is embedded in a first substrate containing fine-L/S RDL to form a substrate module, wherein the RDL is built using a low-curing-temperature polyimide or other suitable materials.

Figure 9A:
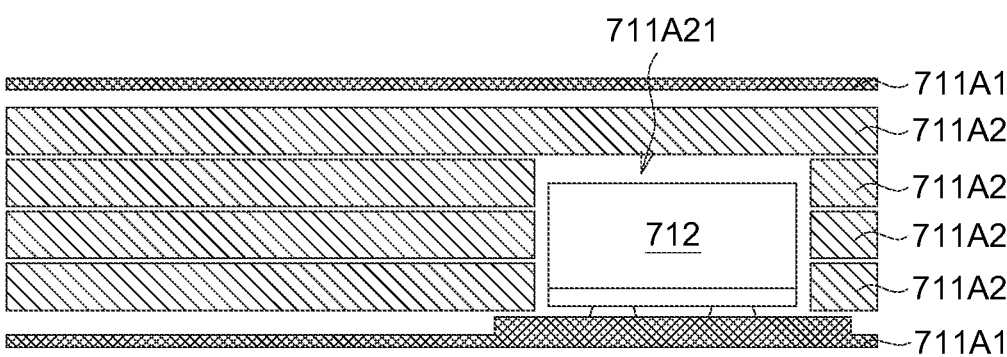
FIGS. 9A to 9G are schematic diagrams of manufacturing processes of the substrate module of FIG. 7 according to an embodiment.
Figure 9B:
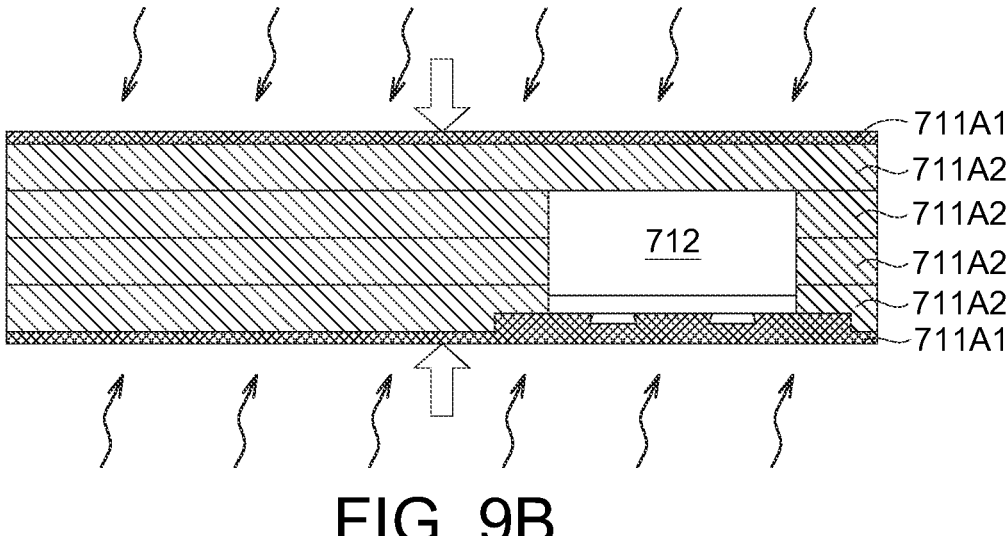

As shown in FIGS. 9A and 9B, a plurality of the first dielectric layers 711A1 and a plurality of the second dielectric layers 711A2 are provided, wherein the dielectric used in the first dielectric layer 711A1 preferably is identical or similar to the dielectric used in the second dielectric 711A21. The first dielectric layer 711A1 can be formed by laser marking of fiducials and deposition (e.g., by printing) of an adhesion layer (again identical to or similar to the dielectric used in the second dielectric layer 711A2) on the base dielectric layer. Subsequently, the semiconductor device 712 is attached to the adhesion layer in the first dielectric layer 711A1. Some layers of a plurality of the second dielectric layers 711A2 are pre-punched to create a recess to subsequently enclose the semiconductor device 712. Following this, a plurality of the second dielectric layers 711A2 (with some layers pre-punched) are stacked on top of the semiconductor device 712 mounted on the lower first dielectric layer 711A1 as shown in FIG. 9A with the upper first dielectric layer 711A1 (similar to the one for bonding of the semiconductor device 712 but without the printed adhesion layer) as needed on top of the 711A2 layers to enclose the semiconductor device 712. Following this, hot press lamination ensues to form the structure shown in FIG. 9B under the application of pressure and heat which melts the dielectric in the first dielectric layer 711A1 and the second dielectric layer 711A2 to encapsulate the semiconductor device 712.

Figure 9C:
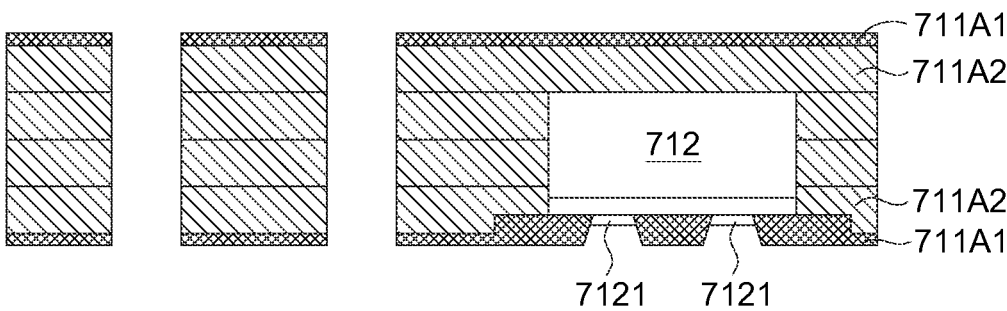
Figure 9D:
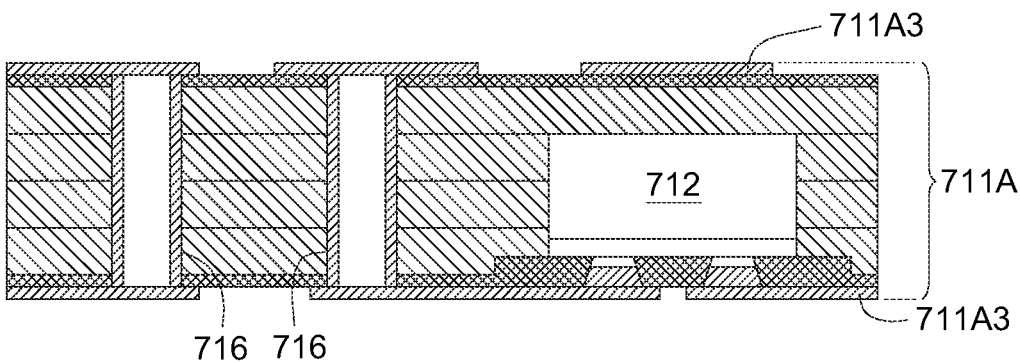

As shown in FIGS. 9C and 9D, at least one conductive through via 716 passing through the first dielectric layers 711A1 and the second dielectric layers 711A2 is created, a plurality of contacts 7121 of the semiconductor device 712 are exposed and a plurality of conductive layers 711A3 are formed on two opposite sides of the first dielectric layers 711A1 to form the core 711A (see FIG. 9D) by, for instance, laser drilling (or mechanical drilling as warranted) to create the through via opening (see FIG. 9C), desmear, thin Cu deposition, photoresist deposition and patterning, Cu plating/hole fill, photoresist removal, thin Cu etching, etc. The conductive layers 711A3 can be electrically connected to the conductive through via 716 and/or the semiconductor device 712.

Figure 9E:
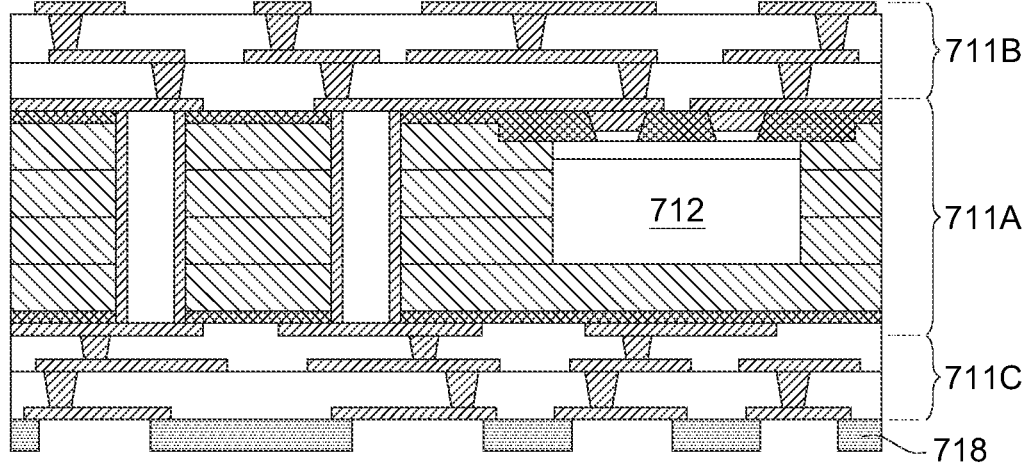

As shown in FIG. 9E, the first build-up structure 711B and the second build-up structure 711C are formed on two opposite sides of the core 711A by ABF (Ajinomoto Build-up Film) deposition/lamination, laser via formation and desmear, thin Cu deposition, photoresist deposition and patterning, Cu plating, photoresist removal and thin Cu etching, repeating the aforementioned processes to create multiple build-up layers and formation of solder mask 718 and bonding pad surface finish on the build-up structure 711C.

Figure 9F:
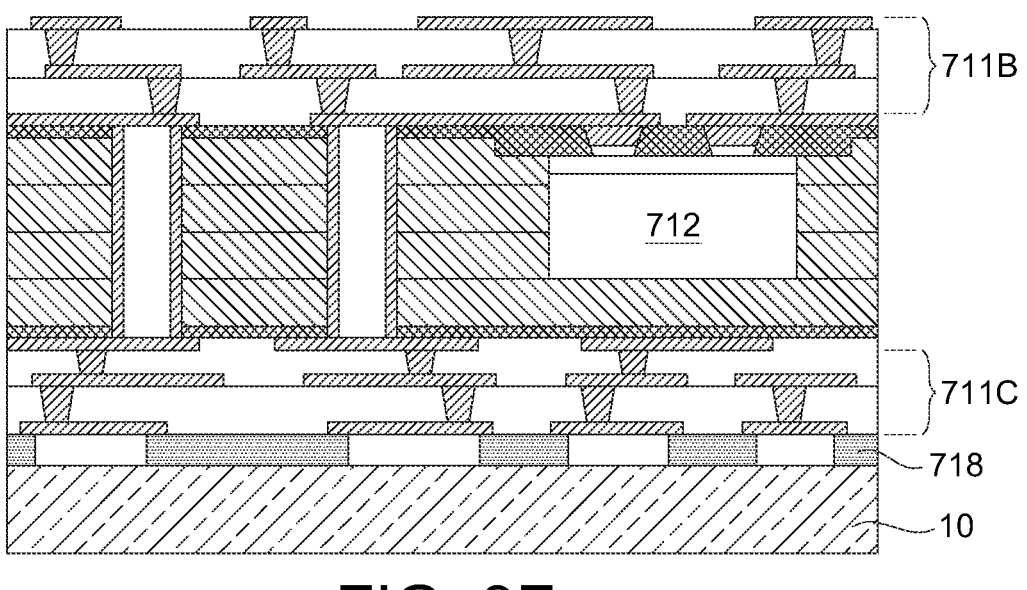

As shown in FIG. 9F, the structure of FIG. 9E is disposed on a temporary carrier 10 (which serves as a mechanical support to minimize effects due to substrate warpage, etc.) with the use of a release layer as the adhesive. The temporary carrier here can be a glass carrier. The release layer can be a polymer-based release/adhesive layer (not shown in FIG. 9F) that allows release of the substrate structure by laser irradiation, thermos-mechanical/chemical, etc. approaches following substrate processing.

Figure 9G:
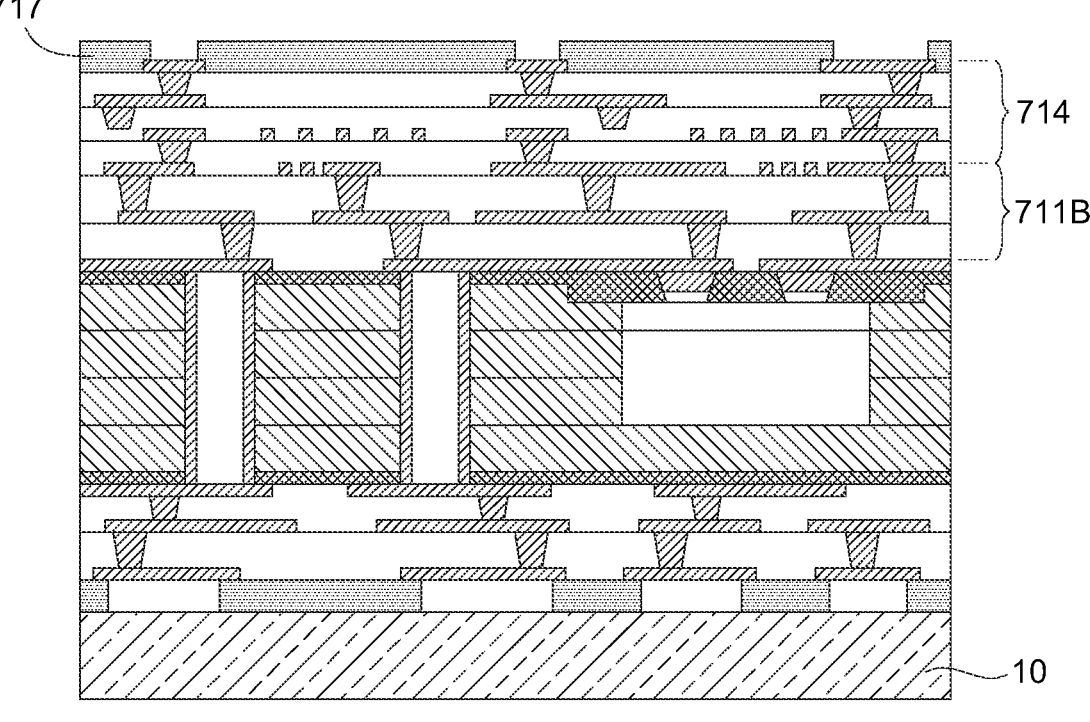

As shown in FIG. 9G, the first RDL 714 is formed on the first build-up structure 711B by deposition of dielectric layer (e.g., a fine-L/S polymer such as a low-curing-temperature photosensitive polyimide) and patterning, seed layer deposition, photoresist deposition, conductor trace definition, electroplating, photoresist strip, metal etching, formation of the first solder mask 717 on the first RDL 714 and bonding pad surface finish, etc.

Then, the temporary carrier 10 of FIG. 9G is removed to form the substrate module 710 of FIG. 7.

In another embodiment, steps of FIGS. 9F to 9G could be omitted.

Figures 10A, 10B:
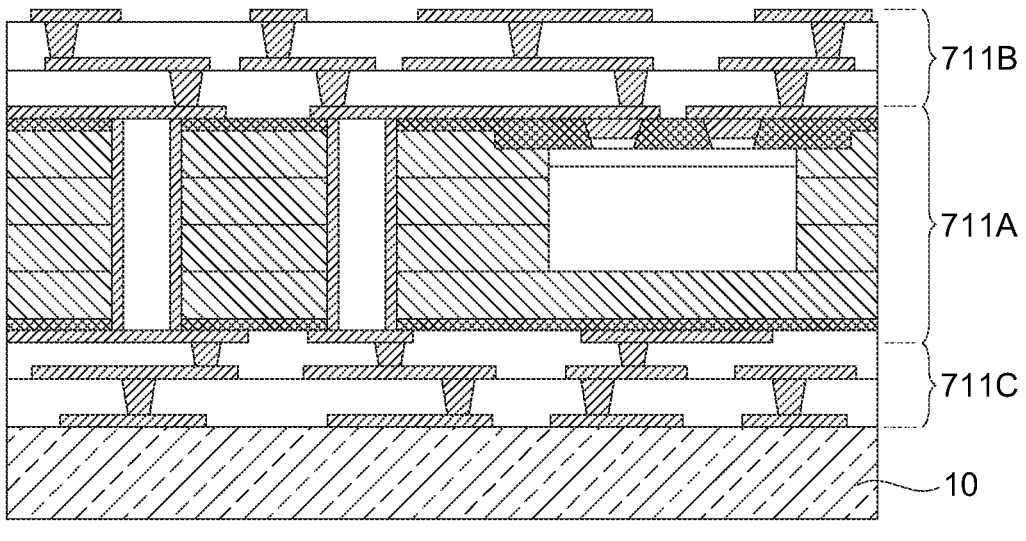
FIGS. 10A to 10C are schematic diagrams of manufacturing processes of the substrate module of FIG. 8 according to an embodiment.
Figure 10C:
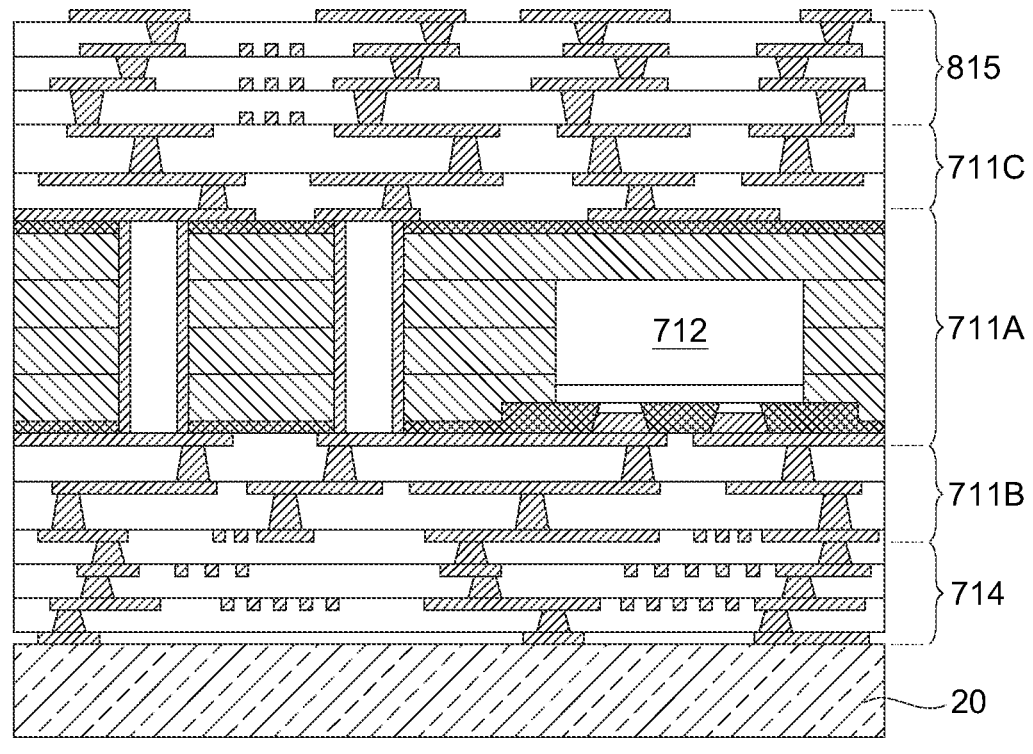

FIGS. 10A to 10C are schematic diagrams of manufacturing processes of the substrate module 810 of FIG. 8 containing fine—L/S RDLs on both the top and bottom sides of the substrate according to an embodiment.

The manufacturing processes of the substrate module 810 of FIG. 8 includes the steps similar to or the same as those of the substrate module 710 of FIG. 7, and the similarities are not repeated again here.

As shown in FIG. 10A, a structure of FIG. 9E without the second solder mask 718 is provided and disposed on the temporary carrier 10.

As shown in FIG. 10B, the first RDL 714 is formed on the first build-up structure 711B by deposition of dielectric layer (e.g., a fine-L/S polymer such as a low-curing-temperature photosensitive polyimide) and patterning, seed layer deposition, photoresist deposition, conductor trace definition, electroplating, photoresist strip, metal etching, etc.

As shown in FIG. 10C, the structure of FIG. 10B is inverted and disposed on another temporary carrier 20 following the release of the substrate structure with the first RDL 714 from the temporary carrier 10. Then, the second RDL 815 is formed on the second build-up structure 711C by processes similar to those used to create the first RDL 714.

Then, the temporary carrier 20 of FIG. 10C is removed to form the substrate module 810 of FIG. 8.

As described above, the process flow shown in FIGS. 9A to 9G involving the embedding of an active component such as the IVR, a passive, and/or beyond (more than one component) will lead to the creation of an IC substrate containing finer-L/S (e.g., 2 μm/2 μm) low-curing-temperature polyimide (Pp/Cu RDL (instead the conventional ABF/Cu RDL) on the top side of the substrate for subsequent processor bonding, and ABF/Cu RDL on the bottom side of the substrate for bonding to the PCB through, for example, solder balls. The finer-L/S RDL can also be created on both the top side (the processor side) and the bottom side of the substrate as shown in FIGS. 10A to 10C as needed. A low-curing-temperature, fine-L/S PI or dielectric is required with a maximum curing temperature preferably not to exceed around 230° C. so as not to degrade the polymer materials, for example, ABF and BT resin (bismaleimide triazine resin, which was developed by Mitsubishi Gas Company of Japan) used to build the rest of the laminate substrate. Even though PI is shown above, other suitable finer-L/S materials can also be used. As indicated above, the flow shown in FIGS. 10A to 10C will lead to an IC substrate containing PI/Cu RDLs on both sides of the substrate as shown in FIG. 8. The processes depicted in FIGS. 9A to 9G preferably can rely on the use of a glass carrier and a laser removable release layer, which together help ensure high-yield, high-productivity substrate panel processing and release of the substrate from the glass carrier. This is important as laminate substrate processing often employs large panels for high productivity, and the flat glass carrier helps ensure minimal warpage and pattern shifts during processing. Using the processes described in FIGS. 9A to 9G and FIGS. 10A to 10C, though not shown, one can create through vias on the four sides of the embedded IVR (or the embedded VR and inductor) and metal plans on top of and on the bottom of the IVR to encage it with a grounded Faraday cage while allowing wiring to pass though the cage. Alternatively, depending on application requirements, a grounded Faraday shield can be formed covering fewer than six sides of the IVR.

In addition to laminate substrate, other substrates can also be considered. They include but no limited to silicon (passive component and active component with active functions such as active die functions or part of them), embedded laminate substrate, leaframe, glass, and glass ceramic, and molding compound with redistribution layers for die embedding (as in leadframe, fanout, package-on-package, package-in-package and other single-die and SiP packages). Processes are available to handle these substrates for embedding, whether they be related to through via creation, and/or formation of metal and redistribution layers). Take silicon substrate as an example, it can be micro-machined as in the case of silicon interposer and MEMS processing to create a cavity with through vias to encase and shield the IVRE or part of it within. This applies to silicon interposers and active dies.

There have been attempts to locate voltage regulators including capacitors and inductors on the ICs. For on-chip applications, IVRE, part of it or power regulator components can be monolithically integrated with the IC with CMOS on-chip capacitive layers, an IVR containing thin film inductors formed in the IC during backend of the line (BEOL) processing, and at least one IVR mounted on the substrate. Passives consume a large IC area. Conventional on-IC inductors tend to have a low quality factor. In an embodiment of this invention, both higher-Q IVRs and passives as needed can be embedded and shielded in the substrate (FIG. 5) along with other EMI/noise sensitive sub-circuitry and/or noisy sub-circuitry at the IC level using through silicon vias (TSVs) that couple electrically conducting layers on the top and bottom surfaces of the silicon substrate to cage active circuitries. The processes described in FIGS. 9A to 9G and FIGS. 10A to 10C could be used to create the embedded structure in FIG. 5 involving embedding of the second voltage regulator component 512B with a top side metal plane in the top side RDL (which can be built with PI or ABF), followed by repeating the process to embed the first voltage regulator component 512A. Small-sized voltage regulating circuitry or sub-circuitry can also be flip chip bonded as needed to the processor chip which tends to be much larger.

Supplying voltage to the second tier of an IC stack presents challenges using wirebond, flip chip and/or through silicon vias (which increases resistance, resulting in voltage drop and decreased performance). One can distribute the IVRE network on substrate, in-substrate and/or in active dies (including active portions of IVRE on the first die bonded to the substrate) to minimize the impact for 2.5D and 3D ICs as illustrated in FIGS. 3 and 4 while minimizing EMI impact.

FIGS. 11A to 11F are schematic diagrams of manufacturing processes of the substrate module 610 of FIG. 6 according to an embodiment.

Figure 11A:
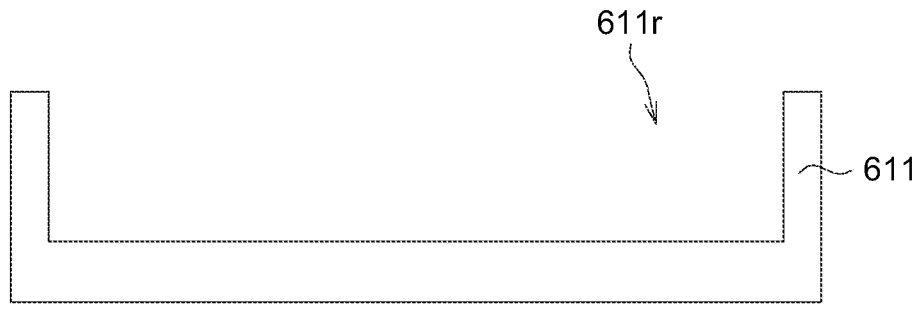
FIGS. 11A to 11F are schematic diagrams of manufacturing processes of the substrate module of FIG. 6 according to an embodiment.

As shown in FIG. 11A, a recess 611r is formed in the first substrate 611 by punching, lamination, etc.

Figure 11B:
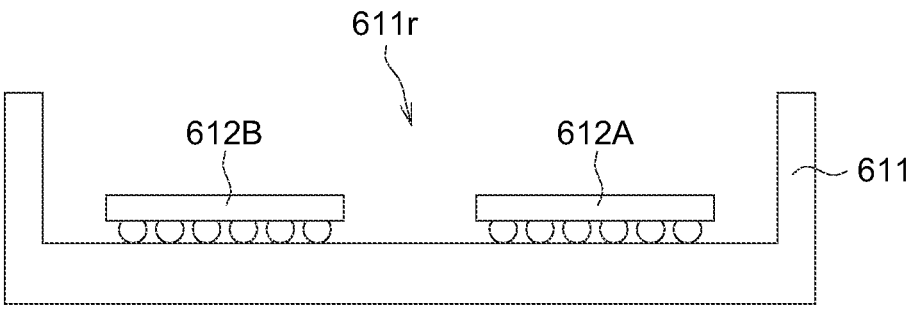

As shown in FIG. 11B, the first voltage regulator component 612A and the second voltage regulator component 612B are disposed within the recess 611r.

Figure 11C:
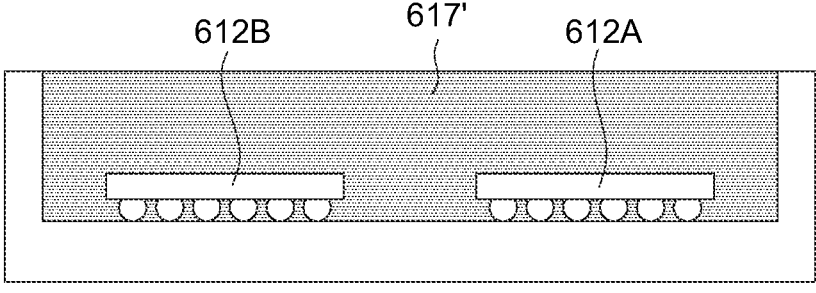

As shown in FIG. 11C, an encapsulation material 617' is formed within the recess 611r and encapsulates the first voltage regulator component 612A and the second voltage regulator component 612B.

Figure 11D:
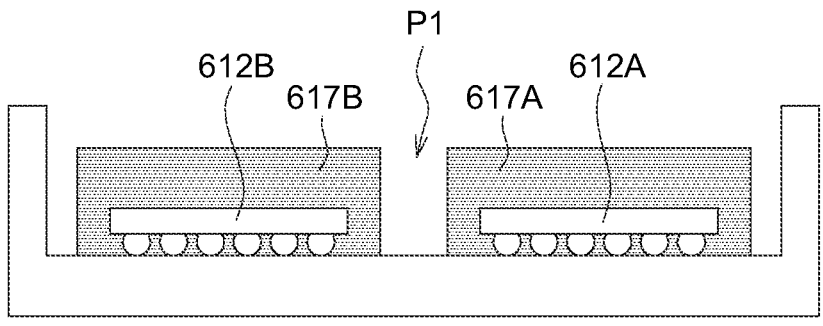

As shown in FIG. 11D (not to scale), at least one interval P1 is created in the encapsulation material 617' by laser drilling, singulating, sawing, etc., to form the first encapsulation body 617A encapsulating the first voltage regulator component 612A and a second encapsulation body 617B encapsulating the second voltage regulator component 612B wherein the first encapsulation body 617A and the second encapsulation body 617B are separated by the interval P1.

Figure 11E:
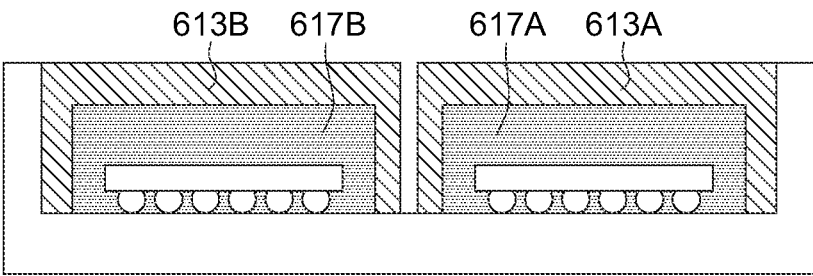

As shown in FIG. 11E, the first grounded Faraday component 613A is formed (or disposed) to cover or surround the first encapsulation body 617A, and second grounded Faraday component 613B is formed (or disposed) to cover or surround the second encapsulation body 617B by sputtering of stainless steel/copper/stainless steel, etc. In addition to stainless steel/copper/stainless steel, other metals such as tin plated steel, carbon steel, and copper alloy 770 (a copper, nickel and zinc alloy)/nickel silver. The shielding layer can generally be made of primarily functional materials, namely, metals and carbon due to their high conductivity and the associated availability of mobile electrons for interacting with the electric field in the radiation. Ceramic, cement and conductive polymers are less effective, but the ions in them can interact with the electric field in the radiation. Numerous types of microcarbons and nanocarbon shielding materials in the form of metal-carbon, ceramic-carbon, cement-carbon, and conductive polymer-carbon combinations have received much attention and can also be considered. Some of these shielding materials can be applied by dispensing or spraying. Due to the limited volume in an electronic device such as a cell phone, functional shielding materials need to be effective at small thicknesses.

Figure 11F:
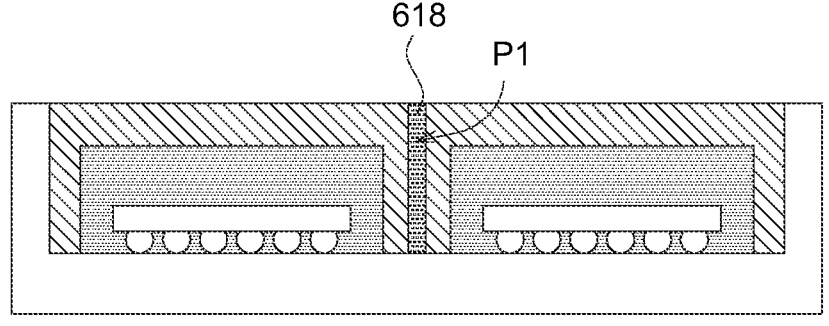

As shown in FIG. 11F, the interval P1 is filled with the metal 618 by, instance, solder or inkjet metal hole filling. The metal 618 could serve as a shielding layer which together with other elements of the grounded Faraday shield/component form compartments that surround the two voltage regulator components, 612A and 612B, and isolate them from other devices nearby.

Then, the first RDL 614 of FIG. 6 is formed on the metal 618, the first grounded Faraday component 613A and the second grounded Faraday component 613B. In an embodiment, the metal 618 could be formed together with the first RDL 614 on the top side and/or on with the second RDL 615 on the bottom side of the first substrate 611.

It will be apparent to those skilled in the art that various modifications and variations could be made to the disclosed embodiments. It is intended that the specification and examples be considered as exemplary only, with a true scope of the disclosure being indicated by the following claims and their equivalents.

What is claimed is:

1. A semiconductor device, comprising:
a substrate module, comprising:
a first substrate;
a first voltage regulator component embedded in the first substrate and comprising a plurality of surfaces;
a first grounded Faraday component embedded in the first substrate and covering one or more of the surfaces of the first voltage regulator component; and
a first processor disposed over the substrate module;
wherein the first substrate has a recess within which the first voltage regulator component is disposed, the recess extends from an upper surface of the first substrate, the upper surface is high than the first voltage regulator component.

2. The semiconductor device as claimed in claim 1, further comprises:

a second substrate over which the first substrate is disposed.

3. The semiconductor device as claimed in claim 1, wherein the substrate module further comprises:
a first RDL containing a metal plane formed on a first side of the first substrate and electrically connected with the first voltage regulator component.

4. The semiconductor device as claimed in claim 3, wherein the substrate module further comprises:
a second RDL containing a metal plane formed on a second side of the first substrate and electrically connected with the first voltage regulator component; and
a conductive through via formed within the first substrate on one side, two sides, three sides or all four sides of the first voltage regulator component connecting the first RDL with the second RDL.

5. The semiconductor device as claimed in claim 1, wherein the first grounded Faraday component is grounded through a ground plane formed in the first substrate which is a fine-line/space substrate.

6. The semiconductor device as claimed in claim 1, wherein the substrate module further comprises:
a second voltage regulator component embedded in the first substrate;
wherein the first voltage regulator component and the second voltage regulator component are disposed side by side.

7. The semiconductor device as claimed in claim 1, wherein the substrate module further comprises:
a second voltage regulator component embedded in the first substrate;
wherein the first voltage regulator component and the second voltage regulator component are disposed in a thickness direction.

8. The semiconductor device as claimed in claim 1, further comprises:
a memory element disposed over the substrate module;
wherein the first processor and the memory element are disposed side by side.

9. The semiconductor device as claimed in claim 1, further comprises:
a first memory element disposed over the first processor.

10. The semiconductor device as claimed in claim 8, further comprises:
a second processor disposed over the substrate module; and
a second memory element disposed over the second processor;
wherein the first processor and the second processor are disposed side by side.

11. The semiconductor device as claimed in claim 1, wherein the first voltage regulator component is disposed within the recess; the substrate module further comprises:
a first encapsulation body formed within the recess and encapsulating the first voltage regulator component; and
the first grounded Faraday component covering the first encapsulation body.

12. The semiconductor device as claimed in claim 11, wherein the substrate module further comprises:
a first RDL formed on the first grounded Faraday component.

13. The semiconductor device as claimed in claim 11, wherein the substrate module further comprises:
a second voltage regulator component disposed within the recess;

a second encapsulation body formed within the recess and encapsulating the second voltage regulator component, wherein the first encapsulation body and the second encapsulation body are separated by an interval;

a second grounded Faraday component covering the second encapsulation body; and a metal filling the interval.

\* \* \* \* \*